(12) United States Patent
Hol et al.

(10) Patent No.: US 7,095,485 B2
(45) Date of Patent: Aug. 22, 2006

(54) LITHOGRAPHIC LINEAR MOTOR, LITHOGRAPHIC APPARATUS, AND DEVICE MANUFACTURING METHOD

(75) Inventors: Sven Antoin Johan Hol, Eindhoven (NL); Johan Cornelis Compter, Eindhoven (NL); Erik Roelof Loopstra, Heeze (NL); Patricia Vreugdewater, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 148 days.

(21) Appl. No.: 10/797,662

(22) Filed: Mar. 11, 2004

(65) Prior Publication Data

US 2004/0246458 A1 Dec. 9, 2004

(30) Foreign Application Priority Data

Mar. 11, 2003 (EP) .................... 03251455

(51) Int. Cl.
G03B 27/58 (2006.01)
G03B 27/62 (2006.01)
H02K 41/00 (2006.01)

(52) U.S. Cl. .............. 355/72; 355/75; 310/12
(58) Field of Classification Search ............. 355/72, 355/75, 53; 310/12–14, 46; 378/34, 35
See application file for complete search history.

(56) References Cited

U.S. PATENT DOCUMENTS

| 4,535,278 A | 8/1985 | Asakawa |
| 5,229,872 A | 7/1993 | Mumola |
| 5,296,891 A | 3/1994 | Vogt et al. |
| 5,519,266 A * | 5/1996 | Chitayat .................. 310/12 |
| 5,523,193 A | 6/1996 | Nelson |
| 5,969,441 A | 10/1999 | Loopstra et al. |
| 6,441,514 B1 * | 8/2002 | Markle .................. 310/12 |
| 6,455,956 B1 | 9/2002 | Sogard |
| 6,471,435 B1 | 10/2002 | Lee |
| 2002/0056548 A1 * | 5/2002 | Nakamura et al. ........ 165/154 |
| 2002/0089239 A1 * | 7/2002 | Emoto et al. ............. 310/12 |
| 2003/0034697 A1 * | 2/2003 | Goldner et al. .......... 310/17 |
| 2003/0080631 A1 * | 5/2003 | Kageyama et al. ........ 310/12 |
| 2003/0102723 A1 * | 6/2003 | Korenaga ................ 310/12 |
| 2003/0197432 A1 * | 10/2003 | Hashimoto et al. ....... 310/12 |
| 2003/0205941 A1 * | 11/2003 | Suzuki et al. ........... 310/49 R |
| 2004/0239911 A1 * | 12/2004 | Carter et al. ........... 355/75 |

FOREIGN PATENT DOCUMENTS

| EP | 1 124 160 A2 | 8/2001 |
| JP | 02001161053 A * | 6/2001 |
| JP | 2002 272087 | 9/2002 |
| WO | WO 98/33096 | 7/1998 |
| WO | WO 98/38597 | 9/1998 |
| WO | WO 98/40791 | 9/1998 |

OTHER PUBLICATIONS

European Search Report in reference to EP 03 25 1455 dated Jan. 30, 2004.

* cited by examiner

Primary Examiner—Rodney Fuller
Assistant Examiner—Kevin Gutierrez
(74) Attorney, Agent, or Firm—Pillsbury Winthrop Shaw Pittman LLP

(57) ABSTRACT

A linear motor having a high driving force, high efficiency and low normal force comprises two opposed magnet tracks and an armature comprising three open coil sets. The linear motor may be used to drive a stage, such as, for example, a mask or wafer stage, in a lithographic apparatus.

17 Claims, 3 Drawing Sheets

LITHOGRAPHIC LINEAR MOTOR, LITHOGRAPHIC APPARATUS, AND DEVICE MANUFACTURING METHOD

BACKGROUND OF THE INVENTION

1. Priority Information

This application claims priority from European Patent Application No. 03251455.6, filed Mar. 11, 2003, herein incorporated by reference in its entirety.

2. Field of the Invention

The present invention relates to a lithographic apparatus, and in particular, to a lithographic linear motor and an associated device manufacturing method.

3. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning device include:

- a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;
- a programmable mirror array: one example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the said non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and
- a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth here above.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features.

This array of procedures is used as a basis to pattern an individual layer of a device, e.g. an IC. Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

It is generally desirous to have the lithographic apparatus achieve as high a throughput (e.g., in wafers exposed per hour), as possible. For a scanning apparatus, an increase in the scanning speed during exposures can provide a substantial increase in throughput. However, the mask and substrate tables, which scanned in synchronism, are heavy, weighing several tens of kg each. Already they are moved very quickly, for example the mask table, which moves at four times the speed of the substrate in an apparatus with a projection lens with a magnification of ¼, is accelerated at about 50 ms$^{-2}$ in a known apparatus. Thus to increase the scanning speeds requires substantially more powerful motors.

SUMMARY OF THE INVENTION

As noted above, to increase scanning speeds requires substantially more powerful motors and existing designs of linear motors, consisting of a magnet plate (stator) and coil block (translator or armature) with 3, 6, 12 or 15 coils, are incapable of being scaled up to achieve the necessary power as this results in excessive heat generation.

For these and other reasons, the principles of the present invention, as embodied and broadly described herein, provide for an improved linear motor having increased efficiency and hence greater drive force without correspondingly higher heat dissipation. In one embodiment, a lithographic projection apparatus is presented, comprising a radiation system for providing a beam of radiation, a support structure for supporting a patterning device that configures the projection beam according to a desired pattern, a substrate holder for holding a substrate, projection system for projecting the patterned beam onto a target portion of the substrate, and a linear motor configured to move either the support structure or the substrate table. The linear motor comprises a first magnet plate, a second magnet plate arranged opposite to the first magnet plate, and an open coil unit, interposed between the first and second magnet plates, including a plurality of coils wound about respective ferromagnetic cores, wherein the first and second magnet plates and the coil unit are relatively moveable.

The use of two opposed magnet plates and an open coil unit, i.e. one in which there is no ferromagnetic connection between the cores of coils of different phases, enables construction of a motor with lower volume for a given force. There may also be an increase in efficiency of the motor because there is additional effective magnet material, and hence higher magnetic forces, whilst the moving mass is reduced. At the same time, the normal force (i.e. the force generated in the direction perpendicular to the driving direction) is reduced by a factor of 500 to 1,000. This provides a substantial additional advantage in that the bearing requirements are greatly reduced, particularly where the motor is to operate in vacuum.

The ferromagnetic cores about which the coils are wound may also be referred to as teeth, as is common practice for linear electromagnetic motors.

In an embodiment of the present invention, the coil unit comprises a plurality of coil sets, each coil set comprising one or more coils and a DC amplifier for each coil set. The different coils per coil set can be connected in series or in parallel. As an alternative to supplying the power by means of a DC amplifier, the coil sets may be powered by a multi-phase AC amplifier.

In one embodiment of the invention, the coil unit comprises three coil sets, each coil set comprising one or more coils, and three DC amplifiers, one driving each coil set. A three-phase AC amplifier may also be used.

Also in another embodiment, the ferromagnetic cores about which said coils are wound project beyond said coils, and coolant conduits provided between said cores and in thermal contact with said coils. The coolant conduits are used to circulate a coolant fluid, e.g. water, during use of the motor and enable efficient cooling without an undue increase in motor size of the moving mass. Efficient cooling enables higher current densities in the coil to be used, allowing an increase in driving force. Preferably, the coolant conduits are formed of a ceramic material, and thereby do not cause any power loss as would occur due to eddy currents in a conductive material.

Moreover, the coils may be wound with foil and thereby have a high thermal conductivity toward the cooling conduits. The use of foil coils may also provide an improved performance in other electromagnetic motors where the coils are wound about a ferromagnetic core.

According to a further aspect of the invention there is provided a device manufacturing method comprising providing a substrate, providing a beam of radiation using a radiation system, imparting a desired pattern onto the beam of radiation by employing a patterning device, projecting the patterned beam of radiation onto a target portion of the substrate, and displacing at least one of the substrate and the patterning device by using a linear motor. The linear motor comprising first and second magnet plates that are arranged opposite to each other, and an open coil unit between the first and second magnet plates, the coil unit comprising a plurality of coils wound about respective ferromagnetic cores, wherein the magnet plates and the coil unit are relatively moveable.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF DRAWINGS

Embodiments of the invention will now be described, by way of example only, with reference to the accompanying schematic drawings in which.

In the Figures, corresponding reference symbols indicate corresponding parts.

DETAILED DESCRIPTION OF THE INVENTION

Lithographic Apparatus

Figure 1:
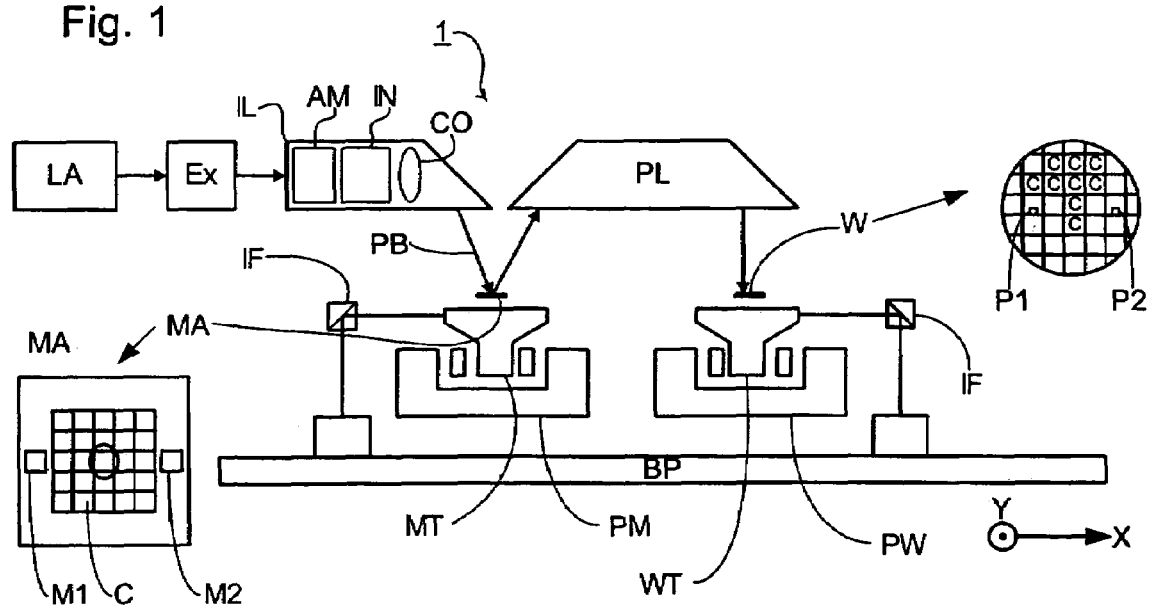
FIG. 1 depicts a lithographic projection apparatus according to an embodiment of the invention.

FIG. 1 schematically depicts a lithographic apparatus according to a particular embodiment of the invention. The apparatus comprises:

a radiation system Ex, IL: for supplying a projection beam PB of radiation (e.g. UV radiation). In this particular case, the radiation system also comprises a radiation source LA;

a first object table (mask table) MT: provided with a mask holder for holding a mask MA (e.g. a reticle), and connected to first positioning mechanism PM for accurately positioning the mask with respect to item PL;

a second object table (substrate table) WT: provided with a substrate holder for holding a substrate W (e.g. a resist-coated silicon wafer), and connected to second positioning mechanism PW for accurately positioning the substrate with respect to item PL; and a projection system ("lens") PL: for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a mercury lamp or an excimer laser) produces a beam of radiation. This beam is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and Claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in a variety of different modes:

step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure;

scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion; and other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Generally, the mask table MT performs a reciprocating motion for successive scanning exposures so that to maintain a relatively high throughput, it is accelerated and decelerated rapidly. A powerful motor having a relatively long stroke to drive the mask table in the Y direction is therefore required.

Figure 2:
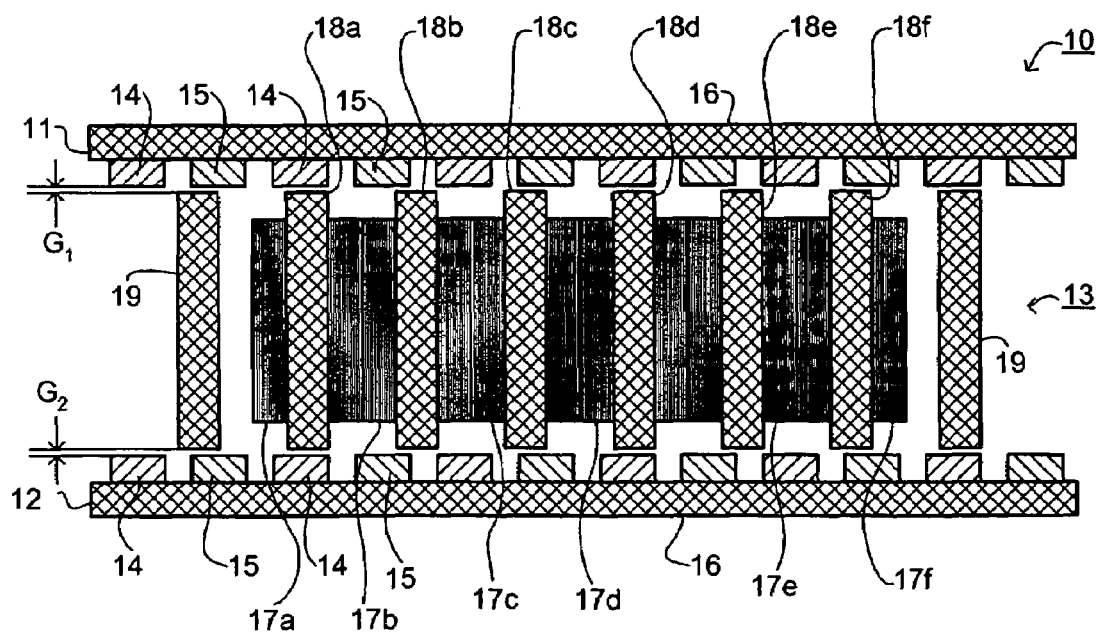
FIG. 2 is a cross-section through a first linear motor according to an embodiment of the invention.

FIG. 2 illustrates a linear motor 10 constructed and operative in accordance with an embodiment of the present invention. The linear motor 10 comprises opposed magnet plates or tracks 11, 12 and a coil unit (translator or armature) 13. The magnet plates 11, 12 comprise permanent magnets 14, 15, alternately oriented N and S pole up, mounted on a back plane 16. Optionally, Halbach magnets can be placed between the permanent magnets 14, 15. Note that only a part of each of the magnet plates 11, 12 is shown, the length of the magnet tracks will be much longer and determined by the desired stroke of the motor.

In the illustrated embodiment, the coil unit 13 comprises 6 coils 17*a–f* wound around respective ferromagnetic cores (teeth) 18*a–f*. Two outer teeth 19 for reducing force ripples during motion and cogging are also provided. The outer teeth 19 may be spaced further from the other cores than the spacing of the other cores and may also be larger, depending on the number of coils. The cores may be formed of laminated, powdered or solid iron or ferromagnetic alloy. A framework (not shown) holds the coils together and connects the coil unit to the driven object.

The six coils 17*a–f* are grouped together in three interleaved sets—17*a* and 17*d*, 17*b* and 17*e* and 17*c* and 17*f*. The three sets each comprise one "phase" of the motor, though there is no internal connection and each coil set is driven via a respective DC amplifier. A three-phase AC amplifier may also be used and the coils can be connected in other configurations such as star, delta or independent.

The gaps, $G_1$, $G_2$, between the teeth 18*a–f* and the magnet plates 11, 12 determine the normal forces exerted on the armature 13. To ensure no normal forces the gaps should be made equal. To provide a normal force of a desired magnitude, e.g. for bearing purposes or gravity compensation, the sizes of the gaps $G_1$, $G_2$ can be set as desired. Mechanical considerations may set a lower limit to the size of the gaps.

The exact materials and dimensions of the motor will be determined according its intended application. The coils 17*a–f* may be made of copper wire or may be wound of foil (e.g. Cu or Al) enabling a filling factor of >0.8. If the magnet pitch is 12 mm (N–S), the teeth pitch 16 mm, the thickness of the magnets=4 mm and the iron core teeth 6 mm×55 mm×38 mm, the motor can provide a drive force of about 670N.

Figure 4:
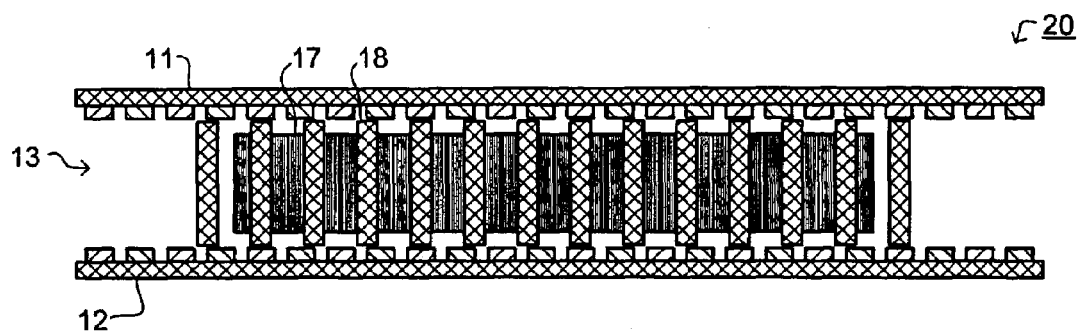
FIG. 4 is a cross-section through a second linear motor according to an embodiment of the invention.

To provide a greater drive force, the number of coils may be increased. FIG. 4 depicts such an embodiment in accordance with the present invention. Motor 20, as shown in FIG. 4, has 12 coils 17 wound around iron teeth 18 and again two outer teeth 19. If made of the same materials and dimensions as the first example, a drive force of 1340N can be achieved.

Figure 5:
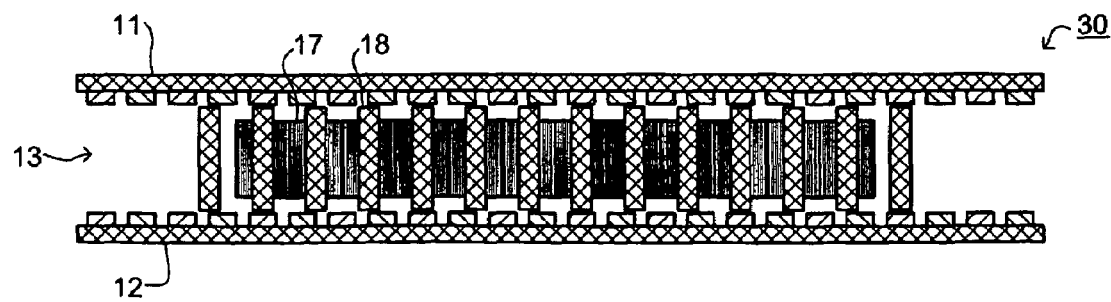
FIG. 5 is a cross-section through a third linear motor according to an embodiment of the invention.

FIG. 5 illustrates another embodiment of the present invention in which, in motor 30, the height of the coils are reduced, and the current density increased to provide a driving force of 1800N.

Figure 3:
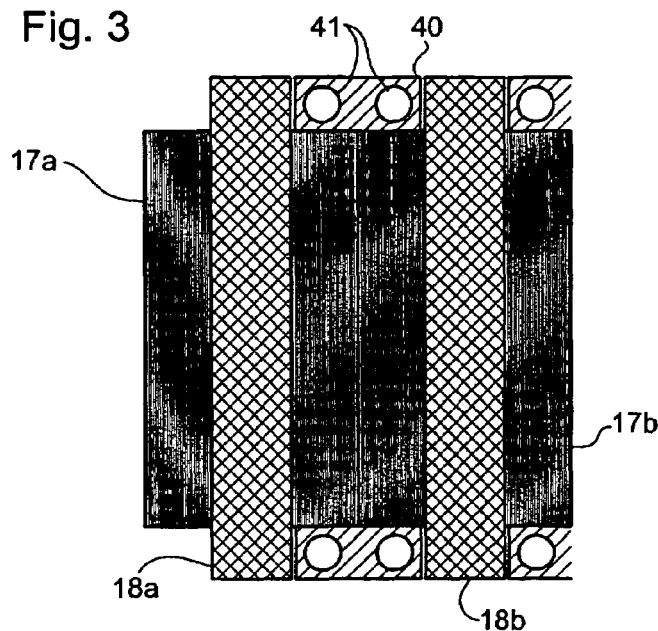
FIG. 3 is an enlarged cross-section of part of the translator of the motor of FIG. 2 showing coolant channels.

To cool the coils, an arrangement as shown in FIG. 3 may be employed. Between the teeth 18*a*, 18*b* where they extend above the coils 17*a*, 17*b*, a ceramic insert 40 is provided. The insert 40 has two conduits 41 within it allowing a coolant, e.g. water, to be circulated around the coils. The insert may instead have one or more conduits that are rectangular in cross-section. Because the insert 40 is ceramic, it does not causes losses through eddy currents. FIG. 3 shows just two coils 17*a*, 17*b* and their respective teeth 18*a*, 18*b* but the same arrangement is provided in each of the gaps between teeth.

Figure 6:
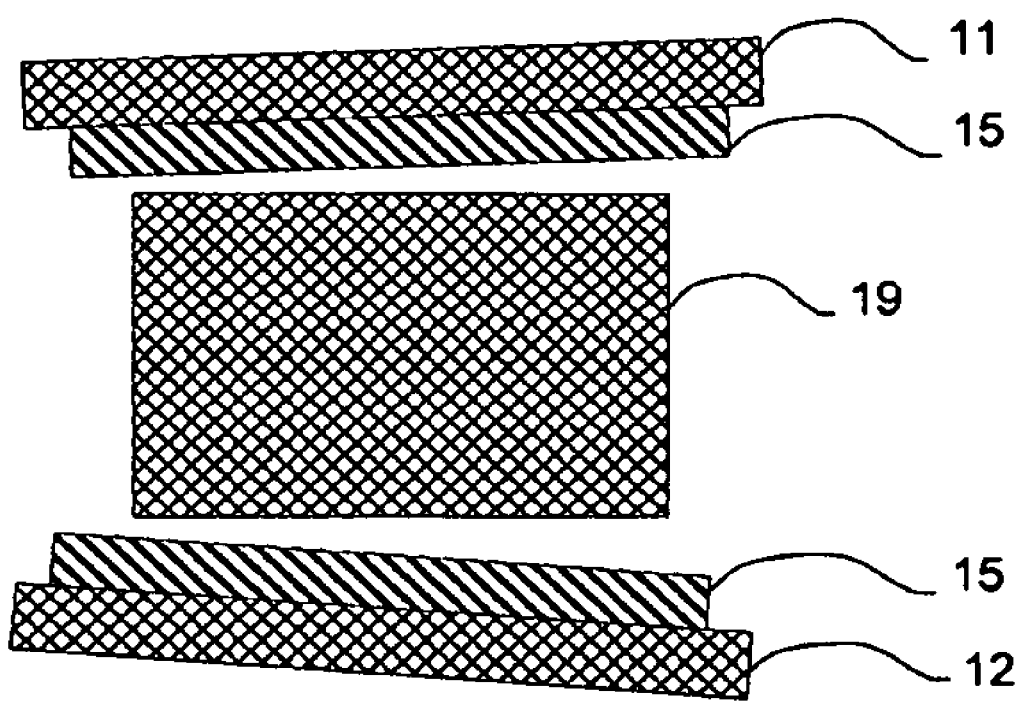
FIG. 6 is a side view of any of the embodiments represented by FIGS. 2, 4, and 5 indicating the alternative embodiment of having magnet plates inclined towards each other.

Whilst specific embodiments of the invention have been described above, it will be appreciated that the invention may be practiced otherwise than as described. For example, the described linear motors may be used to drive the substrate stage of a lithographic projection apparatus or in any other application where a large drive force is required. Moreover, the illustrated embodiments depict two parallel magnet plates, but it will be appreciated that the magnet plates need not be parallel but inclined towards each other as depicted in FIG. 6. If the plates are inclined towards one another, a force component perpendicular to the bisector of the angle between the plates is produced. This force may be controlled by varying the commutation angle applied to the different phases of the motor.

In addition, one of the described magnet plates may be formed as a simple iron plate, with no permanent magnets. Also, the aforementioned use of foil coils wound around a ferromagnetic core should not be limited to the specified embodiments but may result in an improved performance in other electromagnetic motors as well. An example of a motor that might benefit from foil coils is a linear motor comprising of a single magnet plate and a coil unit, the coil unit comprising a single ferromagnetic core having a plurality of ferromagnetic teeth and a plurality of coils each wound around respective ferromagnetic teeth. As yet another example, the use of foil coils may also lead to an improved performance of reluctance motors.

As such, the configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus, comprising:
   a radiation system configured to supplying a beam of radiation;
   a support structure for supporting a patterning device that imparts a desired pattern to said beam of radiation;
   a substrate holder configured to hold a substrate;
   a projection system configured to project said patterned beam of radiation onto a target portion of said substrate; and
   a linear motor configured to move one of said support structure and said substrate table, said linear motor comprising:
      a first magnetic plate;
      a second magnetic plate arranged opposite to said first magnetic plate;
      an open coil unit, interposed between said first and second magnetic plates, including a plurality of coils wound about respective ferromagnetic cores; and
      a pair of ferromagnetic members, each having no coil wound thereon and spaced apart from the outermost coils on each side of the coil unit,
      wherein said first and second magnetic plates and said coil unit are relatively moveable.

2. The lithographic apparatus of claim 1, wherein said coil unit comprises three coil sets with each coil set comprising one or more coils.

3. The lithographic apparatus of claim 1, wherein said ferromagnetic cores project beyond said coils wound around them, and a coolant conduit is provided between said cores and in thermal contact with said coils.

4. The lithographic apparatus of claim 3, wherein said coolant conduit is formed of a ceramic material.

5. The lithographic apparatus of claim 4, wherein said coils comprise a foil.

6. The lithographic apparatus of claim 1, wherein said magnetic plates comprise Halbach magnets.

7. The lithographic apparatus of claim 1, wherein said first and second magnetic plates are inclined towards each other.

8. The lithographic apparatus of claim 7, further including means for varying the commutation angle applied to coils of said coil unit.

9. A device manufacturing method, comprising:
providing a substrate; providing a beam of radiation using a radiation system;
imparting a desired pattern onto said beam of radiation by employing a patterning device;
projecting said patterned beam of radiation onto a target portion of said substrate; and
displacing at least one of said substrate and said patterning device by using a linear motor, said linear motor comprising first and second magnetic plates that are arranged opposite to each other, an open coil unit between said first and second magnetic plates, and a pair of ferromagnetic members, each having no coil wound thereon and spaced apart from the outermost coils on each side of the coil unit, said coil unit comprising a plurality of coils wound about respective ferromagnetic cores,
wherein said magnetic plates and said coil unit are relatively moveable.

10. A linear motor, comprising:
a first magnetic plate;
a second magnetic plate arranged opposite to said first magnetic plate; and
an open coil unit, interposed between said first and second magnetic plates, including a plurality of coils wound about respective ferromagnetic cores; and
a pair of ferromagnetic members, each having no coil wound thereon and spaced apart from the outermost coils on each side of the coil unit,
wherein said first and second magnetic plates and said coil unit are relatively moveable.

11. The linear motor of claim 10, wherein said coil unit comprises three coil sets with each coil set comprising one or more coils.

12. The linear motor of claim 10, wherein said ferromagnetic cores project beyond said coils wound around them, and a coolant conduit is provided between said cores and in thermal contact with said coils.

13. The linear motor of claim 12, wherein said coolant conduit is formed of a ceramic material.

14. The linear motor of claim 13, wherein said coils comprise a foil.

15. The linear motor of claim 10, wherein said magnetic plates comprise Halbach magnets.

16. The linear motor of claim 10, wherein said first and second magnetic plates are inclined towards each other.

17. The linear motor of claim 16, further including means for varying the commutation angle applied to coils of said coil unit.

* * * * *